US012613142B2

(12) United States Patent
Wang

(10) Patent No.: US 12,613,142 B2
(45) Date of Patent: Apr. 28, 2026

(54) COMPLEMENTARY METAL-OXIDE-SEMICONDUCTOR TEMPERATURE SENSOR WITH WIDE-RANGE SENSING CAPABILITY AND HIGH ENERGY-EFFICIENCY

(71) Applicant: Qatar Foundation for Education, Science and Community Development, Doha (QA)

(72) Inventor: Bo Wang, Doha (QA)

(73) Assignee: HAMAD BIN KHALIFA UNIVERSITY, Doha (QA)

( * ) Notice: Subject to any disclaimer, the term of this patent is extended or adjusted under 35 U.S.C. 154(b) by 418 days.

(21) Appl. No.: 18/204,611

(22) Filed: Jun. 1, 2023

(65) Prior Publication Data

US 2023/0392991 A1    Dec. 7, 2023

Related U.S. Application Data

(60) Provisional application No. 63/365,652, filed on Jun. 1, 2022.

(51) Int. Cl.
*G05F 3/30* (2006.01)
*G01K 7/01* (2006.01)
(Continued)

(52) U.S. Cl.
CPC .......... *G01K 7/015* (2013.01); *H03M 1/1014* (2013.01); *H03M 1/1245* (2013.01); *G05F 3/30* (2013.01)

(58) Field of Classification Search
CPC . G05F 3/30; G01K 7/01; G01K 7/015; G01K 15/00; G01K 15/005; H03M 1/014; H03M 1/245
See application file for complete search history.

(56) References Cited

U.S. PATENT DOCUMENTS 5,226,733 A * 7/1993 Mitchell .................. G01K 7/01
                                                       327/512
2006/0056485 A1* 3/2006 Hartley .................... G01K 7/01
                                                       374/170
(Continued)

FOREIGN PATENT DOCUMENTS

EP          1156403 A1 * 11/2001 ............... G05F 3/30

OTHER PUBLICATIONS

Computer translation of EP-1156403 A1 (Year: 2025).*
(Continued)

*Primary Examiner* — Randy W Gibson
(74) *Attorney, Agent, or Firm* — K&L Gates LLP

(57) ABSTRACT

A complementary metal-oxide-semiconductor (CMOS) temperature sensor with wide-range sensing capability and high energy-efficiency is provided by a device, having: a bipolar junction transistor (BJT) core; an Analog to Digital Converter (ADC); a digital controller; and an amplifier configured to receive a selection signal from the digital controller to provide a voltage differential from the BJT core to the ADC at one of a first gain or a second gain, different from the first gain based on a temperature sensed by the BJT core. Additionally, a method of operation thereof is provided that includes: calibrating first and second gains associated with respective first and second temperature ranges for a temperature sensor at a shared temperature; determining whether a reading temperature for the temperature sensor is within the first or second temperature range; and applying one gain based on which temperature range the reading temperature is within.

15 Claims, 14 Drawing Sheets

(51) Int. Cl.
    *H03M 1/10*           (2006.01)
    *H03M 1/12*           (2006.01)

(56)                References Cited

U.S. PATENT DOCUMENTS

2020/0103289 A1*    4/2020    Horng ..................... G01K 7/01
2022/0082450 A1*    3/2022    Singh ..................... G01K 7/01

OTHER PUBLICATIONS

Jawed et al., "Low-Power Area-Efficient Wide-Range Robust CMOS Temperature Sensors", Microelectronics Journal (2013), 44(2), pp. 119-127.
Lu et al., "Multi-Range, Ultra-Lower Power, -20 to 60° C. CMOS Smart Temperature Sensor with ±0.1° C. Accuracy", IEEE (2015), pp. 1-4.
Souri et al., "A CMOS Temperature Sensor with a Voltage-Calibrated Inaccuracy of ±0.15° C. (3σ) from -55° C. to 125° C.", IEEE Journal of Solid-State Circuits (2013), 48(1), pp. 292-301.
Wei et al., "A Low Power Energy-Efficient Precision CMOS Temperature Sensor", Micromachines (2018), 9(6), pp. 1-10.
Yousefzadeh et al., "A BJT-Based Temperature-to-Digital Converter with ±60 mK (3σ) Inaccuracy from -55° C. to +125° C. in 0.16-μm CMOS", IEEE Journal of Solid-State Circuits (2017), 52(4), pp. 1044-1052.

* cited by examiner

300

Calibrate First and Second
Gains at Shared
Temperature                310

Determine Whether
Sensor is in First or Second
Temperature Range          320

Select and Apply Gain
Associated with
Temperature Range          330

Output Measured
Temperature                340

COMPLEMENTARY METAL-OXIDE-SEMICONDUCTOR TEMPERATURE SENSOR WITH WIDE-RANGE SENSING CAPABILITY AND HIGH ENERGY-EFFICIENCY

The present disclosure claims the benefit of U.S. Provisional Patent Application No. 63/365,652 entitled "COMPLEMENTARY METAL-OXIDE-SEMICONDUCTOR TEMPERATURE SENSOR WITH WIDE-RANGE SENSING CAPABILITY AND HIGH ENERGY-EFFICIENCY", which was filed on Jun. 1, 2023, and is incorporated herein in its entirety.

BACKGROUND

With the trend of industrial digital transformation, many sensors are added to systems such as power grids, mechanical bearings, turbines, battery banks, etc., for real-time sensing and operational analysis using the collected data. Information from these sensors can help to identify a potential system problem quickly and safely for predicative maintenance. Among the physical parameters, temperature is often the first indicator of a system malfunction. Temperature sensors are therefore deployed in many industrial settings. In general, sensors are preferred to operate without batteries and (where possible) power cables to reduce the potential risk of damage to the sensor or the system. Such sensors therefore are supplied power via small energy harvesters.

SUMMARY

The present disclosure generally relates to a temperature sensor that can achieve high energy efficiency for an ultra-wide sensing range with the proposed subranging, double-sampling, and constant biasing techniques, and methods of operation thereof. The sensor consists of a bipolar junction transistor (BJT) core, an analog-to-digital converter (ADC) for signal quantization, a reference current generator, a digital controller, and an output processing unit. Specifically, the ADC combines and quantizes the signals $V_{BE0}$, $V_{BE1}$ from the BJT core. The output Biasing Signal (BS) is reconstructed to provide temperature representations in the output processing unit, which consists of a sinc$^3$ filter and a digital linearization block. The signal gain $k_{adc}$ of the ADC is reconfigurable to $k_1$ or $k_2$ as controlled by a signal sel_k. The BJT core and ADC both use the reference current $(I_{REF1}, I_{REF2})$ from the reference current generator as a circuit bias.

The digital controller generates control signals such as en, $f_{cp}$, and $f_{dem}$ for the BJT core, and local_dem, sel_k, $f_s$, $f_{cp}$, $\Phi_{eval}$ for the ADC 120. The controller is implemented in high-Vth devices in this design to minimize device leakage at high temperatures. However, a standard device can also be applied in other implementations.

In light of the present disclosure, and without limiting the scope of the disclosure in any way, in an aspect of the present disclosure, which may be combined with any other aspect listed herein unless specified otherwise. In some embodiments, a temperature sensor is provided, comprising: a bipolar junction transistor (BJT) core; an Analog to Digital Converter (ADC); a digital controller; and an amplifier configured to receive a selection signal from the digital controller to provide a voltage differential from the BJT core to the ADC at one of a first gain or a second gain, different from the first gain, wherein the selection signal is based on a temperature sensed by the BJT core.

In some embodiments of the temperature sensor, the BJT cores senses the temperature based on a reference current received from a reference current generator affected by the temperature.

In some embodiments of the temperature sensor, the temperature sensor further comprises an output processing unit that linearizes a bias signal output from the ADC according to the one of the first gain or the second gain selected by the selection signal.

In some embodiments of the temperature sensor, the output processing unit is calibrated at a shared temperature for both the first gain and the second gain.

In some embodiments of the temperature sensor, the selection signal switches from the one of the first gain or the second gain to a different one of the first gain or the second gain when the temperature sensed by the BJT core is approximately 100 degrees Celsius.

In some embodiments of the temperature sensor, the BJT core includes a P-type metal-oxide-semiconductor (PMOS) diffusion area and an N-type metal-oxide-semiconductor (NMOS) diffusion area, smaller than the PMOS diffusion area.

In some embodiments of the temperature sensor, the selection signal is calibrated at a room temperature.

In some embodiments a method is provided, comprising: calibrating, at a shared temperature, a first gain and a second gain, different from the first gain, for a temperature sensor, wherein the first gain is associated with a first temperature range and the second gain is associated with a second temperature range different from the first temperature range; determining whether a reading temperature by the temperature sensor is within the first temperature range or the second temperature range; and applying, based on which of the first temperature range or the second temperature range that the reading temperature is within, one of the first gain or the second gain to a temperature reading signal.

In some embodiments of the method, the first temperature range includes temperatures that are equal to and below a given temperature and the second temperature range includes temperatures that are equal to and below the given temperature.

In some embodiments of the method, the shared temperature is a room temperature, between 15 and 30 degrees Celsius, and the given temperature is between and 110 degrees Celsius.

In some embodiments a temperature sensing system is provided, the system comprising: a bipolar junction transistor (BJT) core; an Analog to Digital Converter (ADC); an amplifier; and a digital controller, configured to perform operations, including: calibrating, in the amplifier, a first gain and a second gain, different from the first gain, at a shared temperature, wherein the first gain is associated with a first temperature range and the second gain is associated with a second temperature range different from the first temperature range; determining whether a reading temperature measured by the BJT core is within the first temperature range or the second temperature range; generating a selection signal for the amplifier to apply one of the first gain or the second gain based on which of the first temperature range or the second temperature range that the reading temperature is within; and digitizing, via the ADC, the reading temperature for output of the reading temperature.

In some embodiments of the system, the system further comprises an output processing unit that linearizes a bias signal output from the ADC according to the one of the first gain or the second gain selected by the selection signal.

In some embodiments of the system, the system further comprises a reference current generator that is affected by temperature changes and supplies a first reference current to the BJT core by which to measure the reading temperature.

In some embodiments of the system, the first temperature range includes temperatures that are equal to and below a given temperature and the second temperature range includes temperatures that are equal to and below the given temperature.

In some embodiments of the system, wherein the shared temperature is a room temperature, between 15 and 30 degrees Celsius, and the given temperature is between 90 and 110 degrees Celsius.

The reader will appreciate the foregoing details, as well as others, upon considering the following detailed description of certain non-limiting embodiments including a system and method for detecting an abusive online content according to the present disclosure.

DETAILED DESCRIPTION

The present disclosure generally relates to a temperature sensor that can achieve high energy efficiency for an ultra-wide sensing range with the proposed subranging, double-sampling, and constant biasing techniques.

Figure 1:
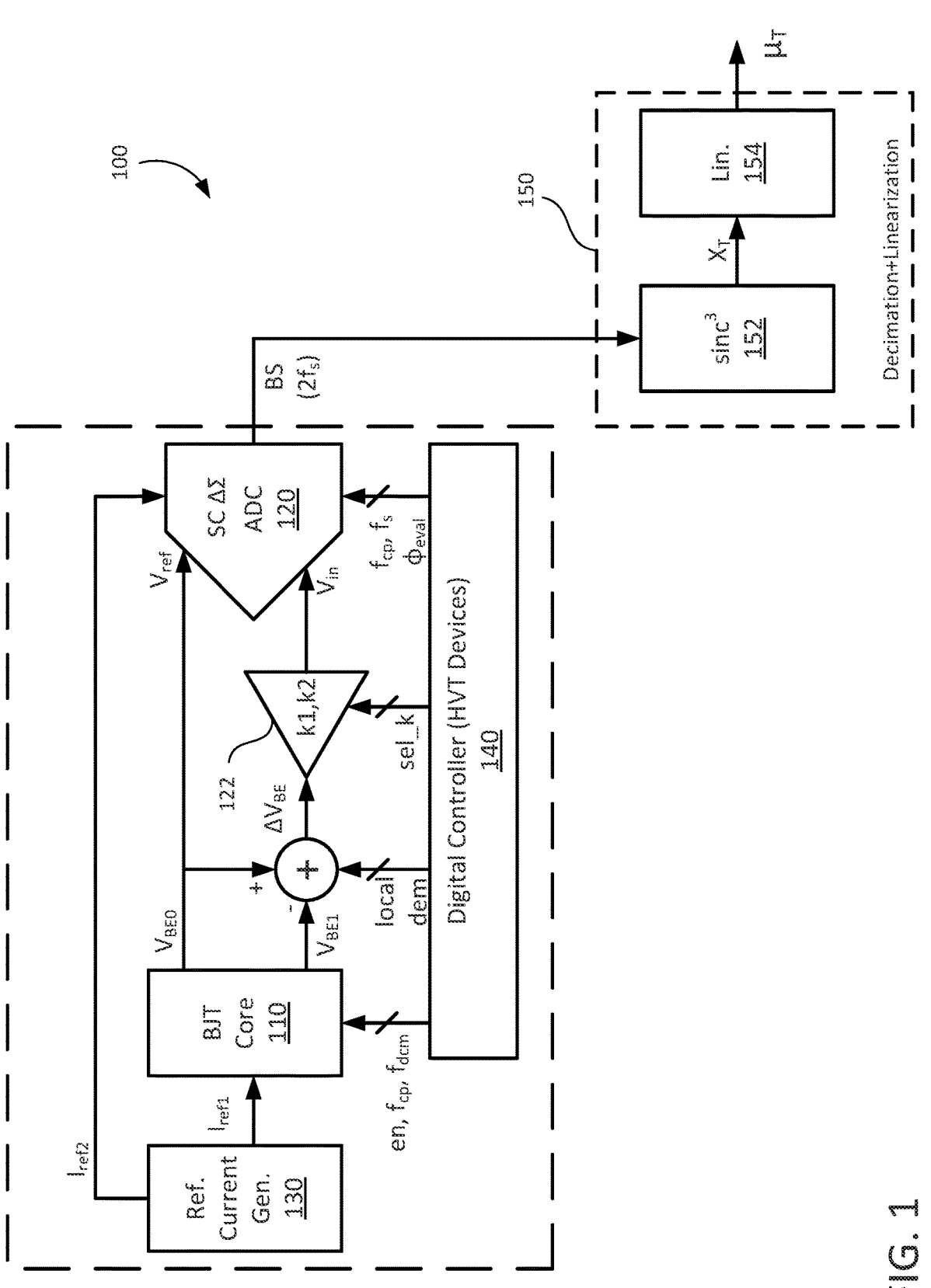
FIG. 1 illustrates a sensor, according to embodiments of the present disclosure.

FIG. 1 illustrates a sensor 100, according to embodiments of the present disclosure. As illustrated in FIG. 1, the sensor 100 includes a bipolar junction transistor (BJT) core 110, an analog-to-digital converter (ADC) 120 for signal quantization, a reference current generator 130, a digital controller 140, and an output processing unit 150. Specifically, the ADC 120 combines and quantizes the signals $V_{BE0}$, $V_{BE1}$ from the BJT core 110. The output Biasing Signal (BS) is reconstructed to provide temperature representations in the output processing unit 150, which includes a $sinc^3$ filter 152 and a digital linearization block 154. The signal gain $k_{adc}$ imparted by an amplifier 122 of the ADC 120 is reconfigurable to $k_1$ or $k_2$ as controlled by a signal sel_k. The BJT core 110 and ADC 120 both use the reference currents ($T_{REF1}$, $I_{REF2}$) from the reference current 130 generator as a circuit bias.

The digital controller 140 generates control signals such as en, $f_{cp}$, and $f_{dem}$ for the BJT core 110, and local_dem, sel_k, $f_s$, $f_{cp}$, $\Phi_{eval}$ for the ADC 120. In various embodiments, the controller 140 is implemented in high-Vth devices in this design to minimize device leakage at high temperatures. However, a standard device can also be applied in other implementations. In various embodiments, the digital controller 140 is a computing device (e.g., a microchip) that includes a processor or processing functionality and non-transitory computer-readable memory that stores instructions that the digital controller 140 performs/executes to perform various operations for selecting and outputting the various control signals based on various input signals.

During conversion, the signals $V_{BE0}$ and $V_{BE1}$ are combined and digitized per Formula 1, below, after digital filtering by the $sinc^3$ filter 152, where $X_T$ is a nonlinear representation of temperature, and that is linearized according to Formula 2 by the linearization block 154, where a is a process-dependent constant, and k is either $k_1$ or $k_2$ (the selected gain of the ADC 120).

$$X_T = (k(V_{BE0} - V_{BE1}))/V_{BE0} \qquad \text{Formula 1:}$$

$$\mu_T = \alpha/(\alpha + k/X_T) \qquad \text{Formula 2:}$$

The final temperature can be derived according to Formula 3, where A and B are process-dependent interpolation constants (derived from sample testing) to finally map the sensor output $X_T$ to an actual temperature T.

$$T = A\mu_T - B \qquad \text{Formula 3:}$$

Figure 2A:
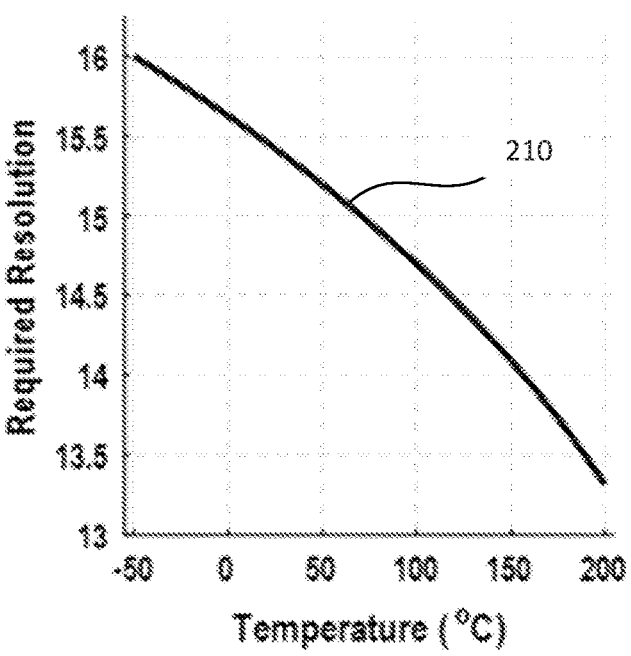
FIGS. 2A-2D are temperature charts, associated with a method of using subranging to improve the energy efficiency of the sensor, according to embodiments of the present disclosure.
Figure 2B:
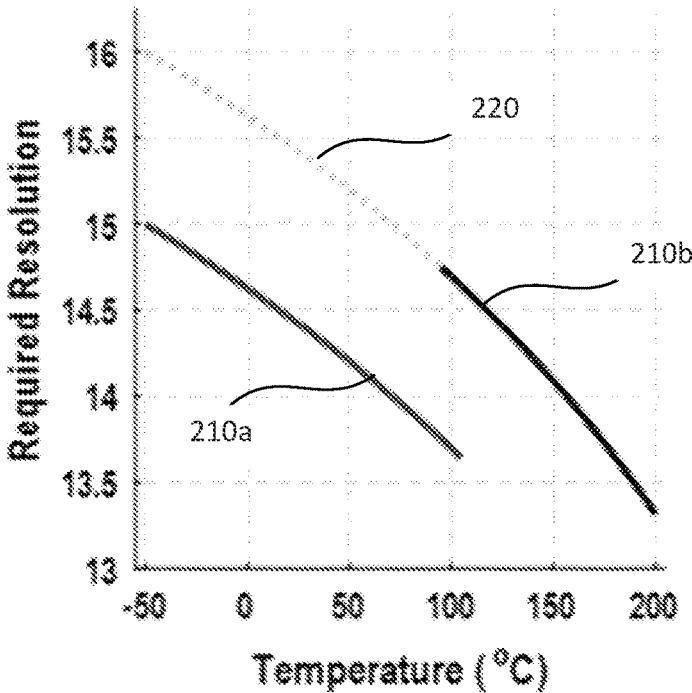
Figure 2C:
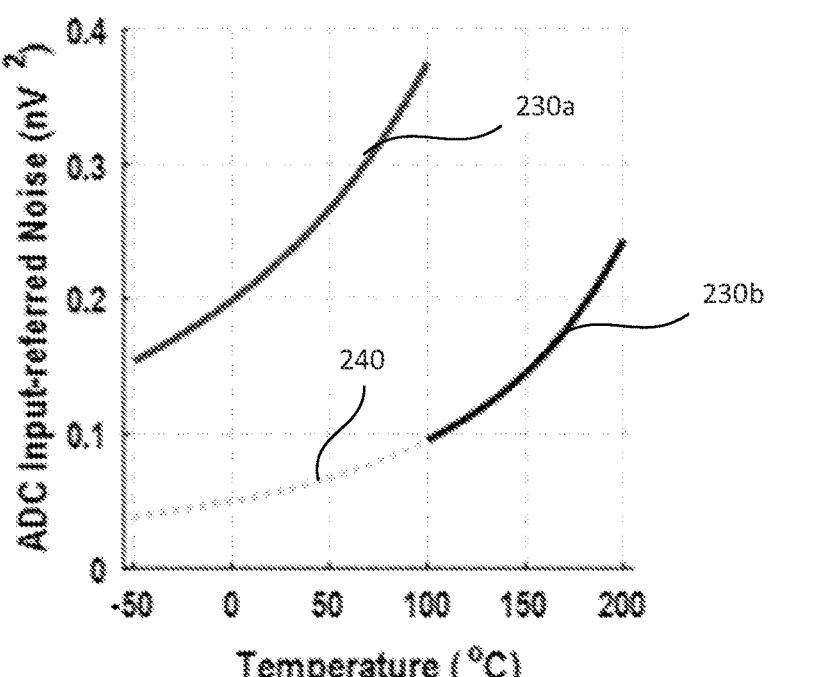
Figure 2D:
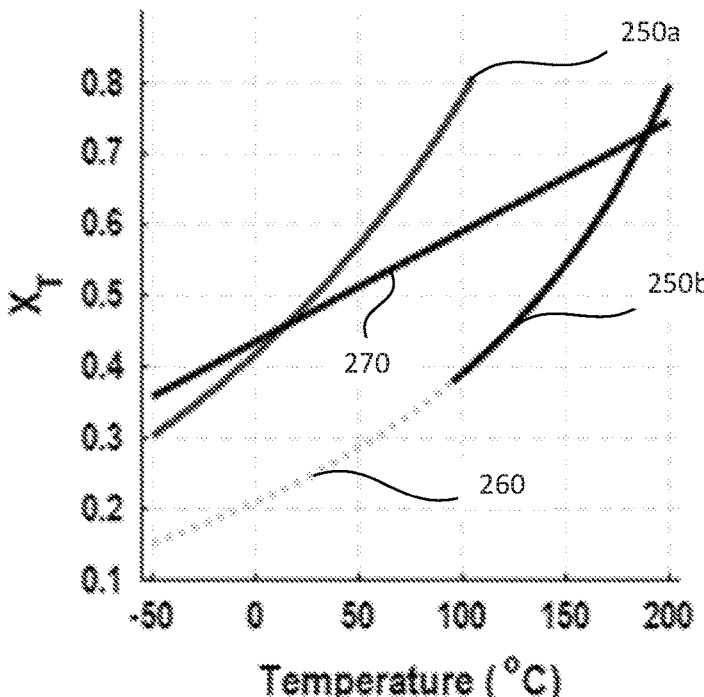
Figure 3:
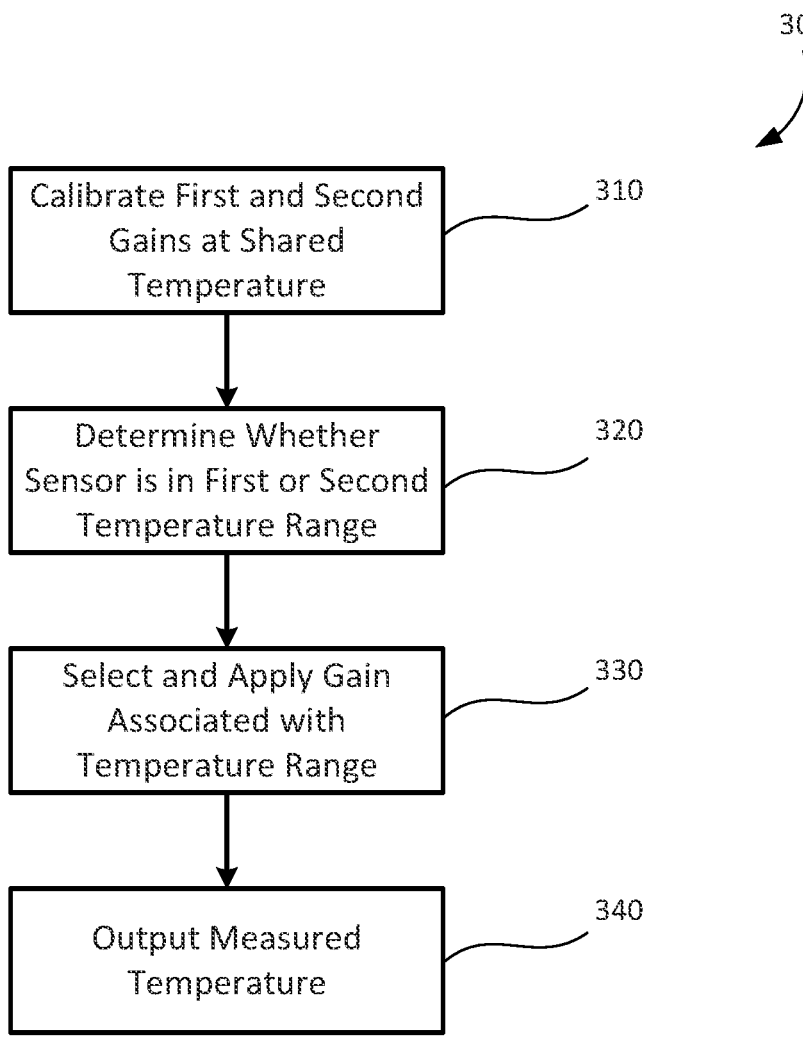
FIG. 3 is a flowchart of a method for subranging, according to embodiment's of the present disclosure.

FIGS. 2A-2D are temperature charts, associated with a method 300 of using subranging to improve the energy efficiency of the sensor 100 (e.g., to decrease the system requirements of the sensor 100) shown in the flowchart of FIG. 3, according to embodiments of the present disclosure. Compared digitizing $k\Delta V_{BE}/V_{BE}$ with a fixed gain, the present method varies the gain (e.g., the k value) at different temperature ranges, which can relax the system resolution requirement, also referred to as the ADC (readout) input-referred noise level.

FIG. 2A illustrates the resolution/temperature curve 210 of a sensor deployed to operate in a single range (illustrated from −50 to 200 degrees Celsius).

FIG. 2B illustrates a first resolution/temperature curve 210a and a second resolution/temperature curve 210b of a sensor deployed to operate in two subranges across the same temperature range as the sensor shown in FIG. 2A (e.g., from −50 to 200 degrees Celsius). An extrapolated resolution/temperature curve 220 extends from the second resolution/temperature curve 210b and shows the required resolution of the sensor if the sensor were required to operate over the entire range.

FIG. 2C illustrates a first noise/temperature curve 230a and a second noise/temperature curve 230b of a sensor deployed to operate in two subranges across the same temperature range as the sensor shown in FIG. 2A (e.g., from −50 to 200 degrees Celsius). An extrapolated noise/temperature curve 240 extends from the second resolution/temperature curve 230b and shows the noise of the sensor if the sensor were required to operate over the entire range.

FIG. 2D illustrates a first non-linear temperature curve 250a and a second non-linear/temperature curve 250b of a sensor deployed to operate in two subranges across the same temperature range as the sensor shown in FIG. 2A (e.g., from −50 to 200 degrees Celsius). An extrapolated non-linear temperature curve 260 extends from the second non-linear temperature curve 250b and shows the non-linear temperature output by of the sensor if the sensor were required to operate over the entire range. FIG. 2D also shows the linear output curve 270. Note that subranging does not affect the linearized output curve 270; the linearized output curve 270 is seamless and does not "jump" at the cross-over temperature between the two gains.

To avoid the mismatch between the two signal gains ($k_1$, $k_2$) causing a discontinuous curve after linearization, the sensor converts the same temperature twice using both $k_1$ and $k_2$ for use as a shared calibration point. For example, the sensor may calibrate at a room temperature (T) without precise temperature control using both $k_1$ and $k_2$. Accordingly, the gain mismatch can be quantified and corrected. In this way, the proposed sensor with subranging can use one-point calibration, despite using multiple selectable gains.

Although illustrated with two subranges, with two associated signal gains, in various embodiments, more subranges with associated different signal gains can be used. In various embodiments, the various ranges FIG. 3 is a flowchart of a method 300 for subranging, according to embodiment's of the present disclosure. Method 300 begins at block 310, where a controller calibrates, at a shared temperature, a first gain and a second gain, different from the first gain, for a temperature sensor 100. In various embodiments, the shared temperature is a room temperature (e.g., approximately (+/−10%) 10-35, 10-30, 15-30, or 15-35 degrees Celsius). Each of the gains are associated with a different temperature range for measurement by the temperature sensor 100, such that a first range includes the temperatures equal to or below a given temperature, while the second range includes the temperature equal to or above a given temperate. As will be appreciated, in various embodiments, the given temperature may include a range of temperatures such that the first and second ranges overlap by 5-10 degrees. For example, for temperature ranges that overlap at a given temperature of approximately (+/−10%) 100 degrees Celsius, the first range may include temperatures equal to or below 110 degrees Celsius, and the second range may include temperatures equal to or above 90 degrees Celsius.

Once the gains are calibrated to achieve accurate temperature readings in the associated temperature ranges, such that the first gain and the second gain, when applied to a temperature reading signal at the shared temperature produce approximately (+/−10%) the same temperature reading, method 300 proceeds to block 320, where the sensor 100 transitions to a measurement or sampling mode to measure the temperature, and the controller determines whether the sensor is in the first or second temperature range. In various embodiments, a current source that is affected by temperature change is used as a reference to determine a current temperature experienced by the sensor, which the controller uses to identify which temperature range the sensor is experiencing.

At block 330, based on which of the first temperature range or the second temperature range that the controller determined that the reading temperature is within (per block 320), the controller selects and applies the gain associated with the identified temperature range. This gain is applied to the voltage output difference ($\Delta V_{BE}$) generated by the BJT core 110 via the ADC 120, which is output from the sensor as a biasing signal BS to an output processing unit 150 to ouput as a measured temperature per block 340.

Figure 4:
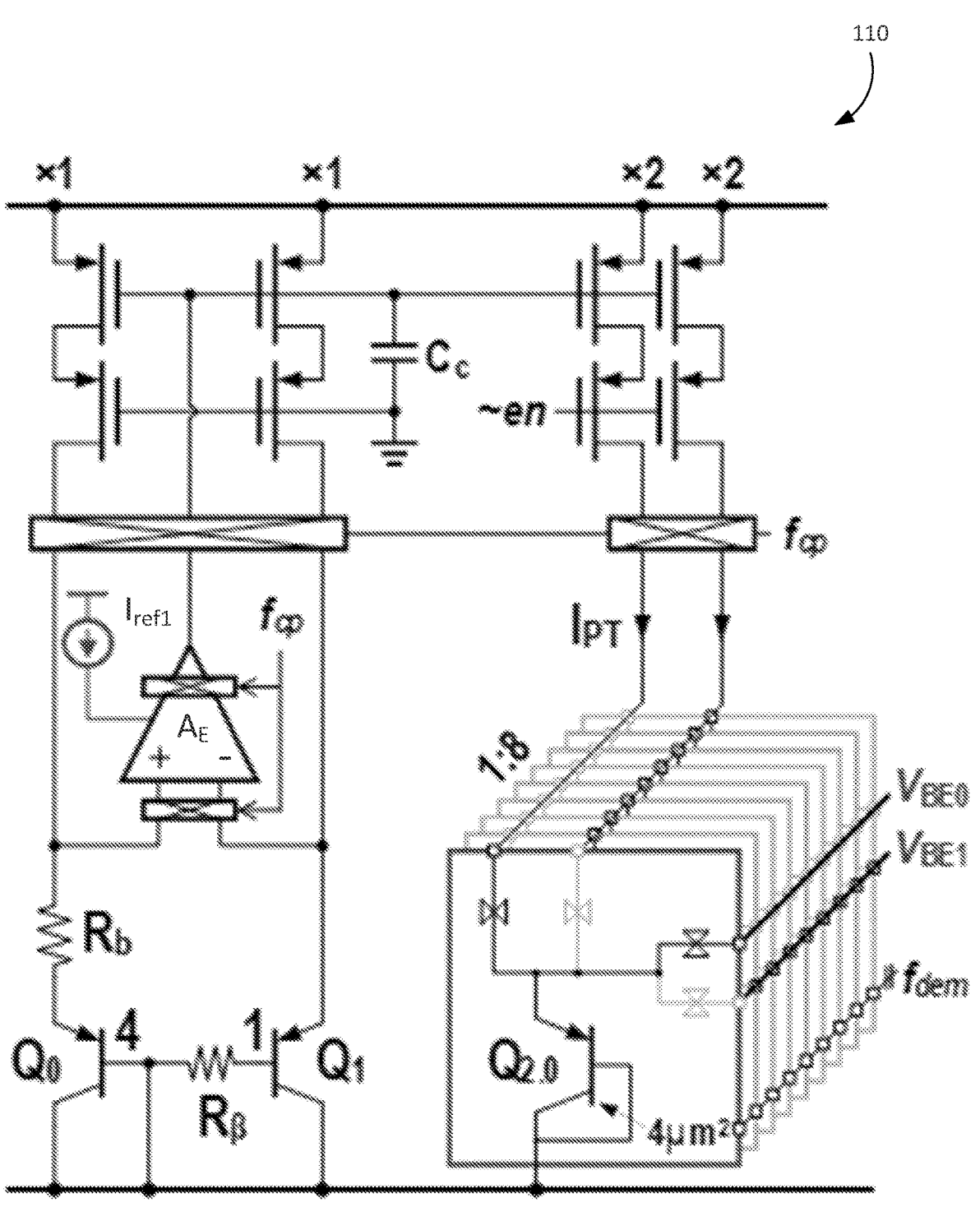
FIG. 4 shows an implementation of the BJT core, according to embodiments of the present disclosure

FIG. 4 shows an implementation of the BJT core 110 (also referred to as a sensor frontend), according to embodiments of the present disclosure. This BJT core 110 also adopts the classical beta-cancellation bias technique. In some embodiments, standard dynamic error correction techniques are also used in this design. For example, chopping, dynamic element matching (DEM), and combinations thereof can be adopted for the error amplifier, current mirror and BJT pair.

For high temperature operation, the switch resistances vary significantly, and the BJT bias current $I_{PT}$ also changes greatly. The example in FIG. 4 uses a four-wire connection at the BJT output. No current flows through the switches connected to $V_{BE0}$ and $V_{BE1}$, which are the core signals of the senor front-end. Therefore, these two signals are not affected by switch on-resistance induced errors. Additionally, to reduce the switch body leakage, this design uses a cost-effective leakage compensation structure.

Figure 5A:
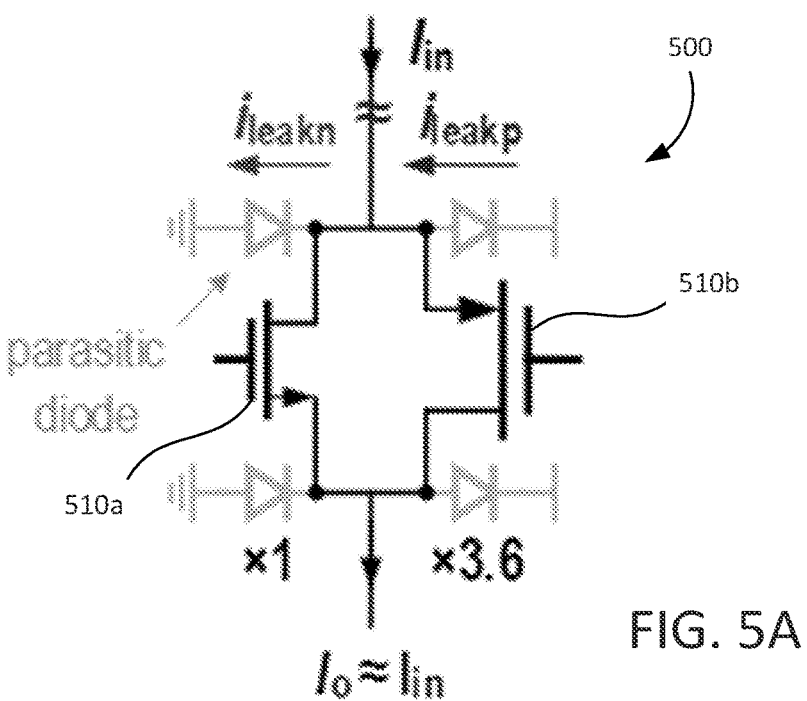
FIGS. 5A-5B show the designed switch (transmission gate), according to embodiments of the present disclosure.
Figure 5B:
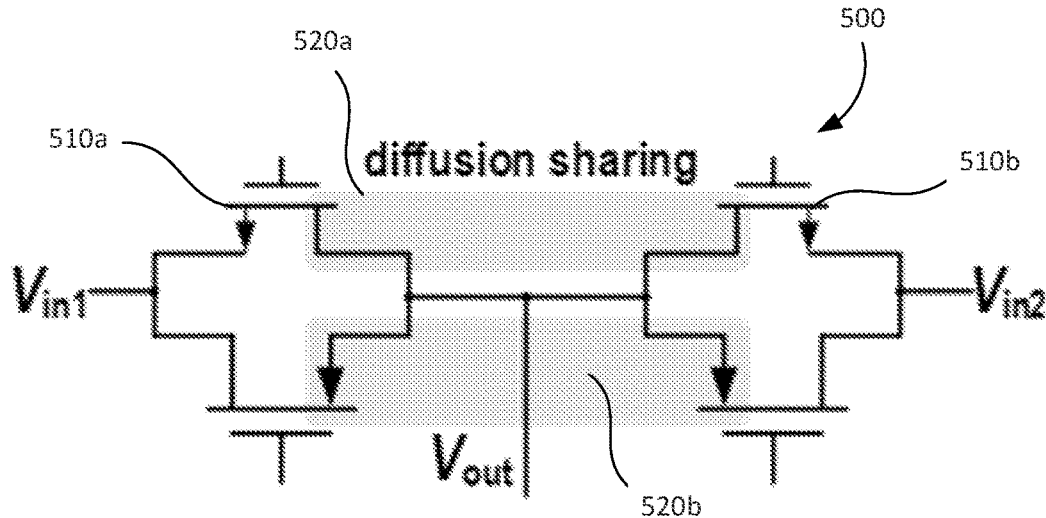

FIGS. 5A-5B show the designed switch 500 (transmission gate), according to embodiments of the present disclosure. The designed switch 500 consists of an N-type metal-oxide-semiconductor (NMOS) transistor 510a and a P-type metal-oxide-semiconductor (PMOS) transistor 510b. The body leakage current direction of the NMOS transistor 510a and the PMOS transistor 510b are on opposite sides from one another. In the illustrated example, the PMOS diffusion area 520b (source diffusion and drain diffusion) is drawn to be 3.6 times that of the NMOS diffusion area 520a. Based on the process model, the final body leakage of NMOS transistor 510a and PMOS transistor 510b are counter-balanced, and the net leakage is reduced or minimized. Note that for different processes, the PMOS/NMOS source and drain diffusion area ratio can be different, which can be derived from the device simulation during design stage. The switch diffusions are shared whenever possible in the layout to maintain the total body leakage of a switch pair to be the same as that of a single switch as shown in FIGS. 5A-5B.

Figure 6A:
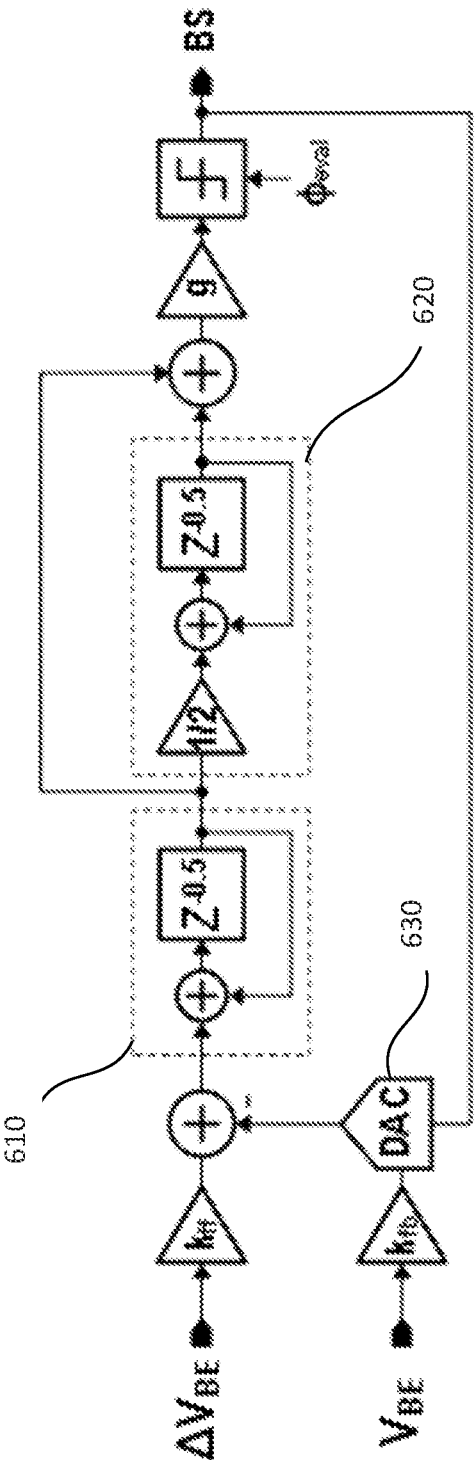
FIG. 6A-6C show a block diagram of the readout data converter, according to embodiments of the present disclosure.
Figure 6B:
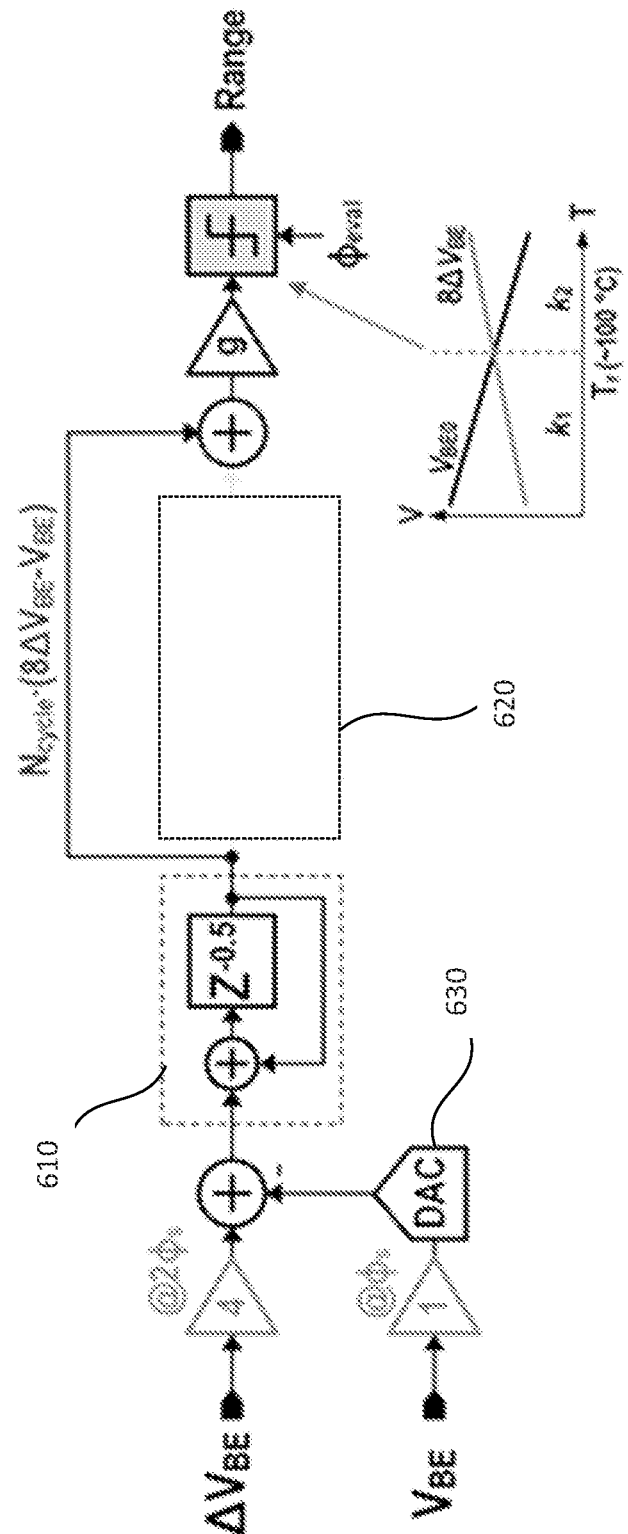
Figure 6C:
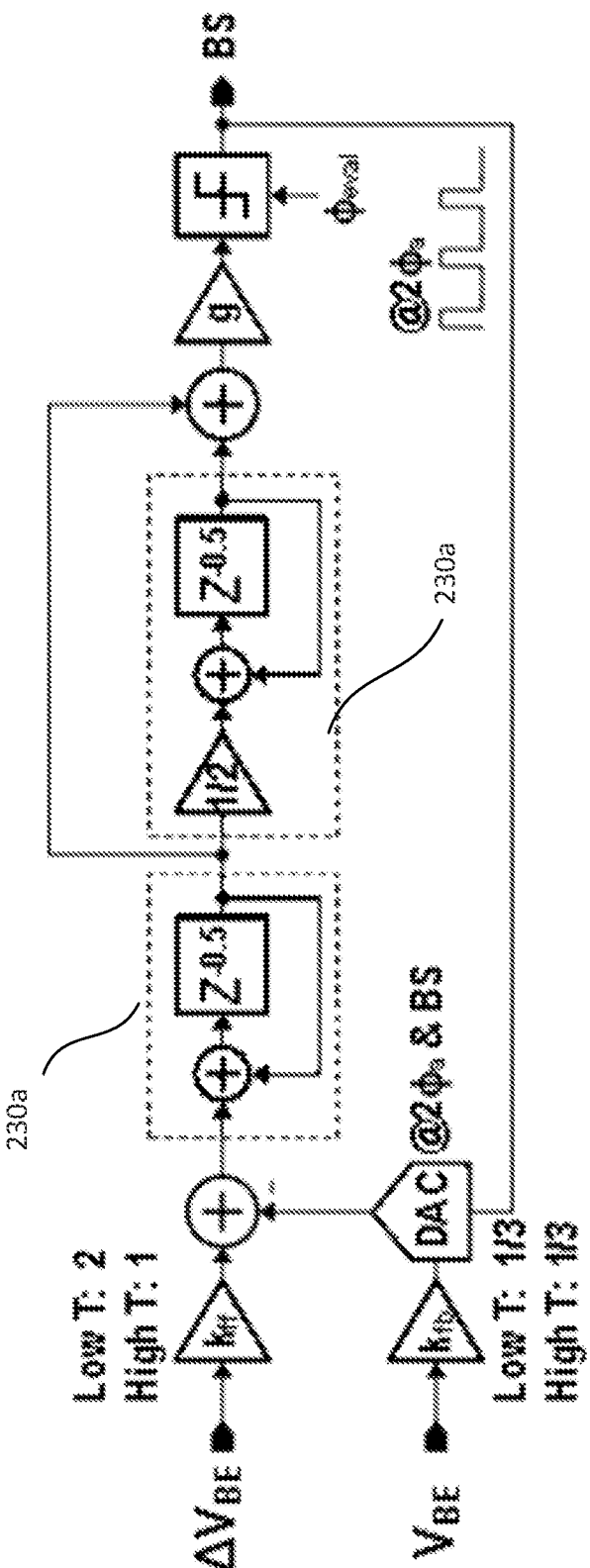

FIGS. 6A-6C show a block diagram of the readout data converter 120, according to embodiments of the present disclosure. The readout data converter 120 is an incremental ADC with the signal $\Delta V_{BE}$ (equals to $V_{BE0}$–$V_{BE1}$) gain $k_{ff}$, and feedback signal $V_{BE}$ gain $k_{fb}$ being reconfigurable ($k_{adc}$=$k_{ff}$/$k_{fb}$). The integrator is double sampled. Only one feedback digital to analog converter (DAC) 630 is used to achieve double sampling to avoid the quantization noise folding caused by DAC mismatch. The DAC control of the present example can achieve common-mode signal cancellation and reduce or minimize the signal dependent charge injection.

FIG. 6B shows a block diagram of the readout data converter 120 during subranging, according to embodiments of the present disclosure. The output from the first stage 610 bypasses the second stage 620, and the whole readout data converter 120 behaves as a single integrator. In the present example, the signal gain $k_{ff}$ is 4, $\Delta V_{BE}$ is controlled to be double sampled (e.g., twice per clock cycle), the feedback gain $k_{fb}$ is 1, and $V_{BE}$ is controlled to be sampled only once per clock cycle. As a result, the integrated signal at the first integrator output is $N_{cycle}(8 \cdot \Delta V_{BE} - V_{BE})$, where $N_{cycle}$ is the operational clock cycle. The polarity of this signal (determined by a comparator) determines the gain to be used by the sensor in the final temperature conversion. In the present example, $k_{ff}$=4 and $k_{fb}$=1 resulting in the subrange transition temperature $T_r$ being around 100 degrees Celsius. Note that other gain combinations can produce other transition temperatures $T_r$ based on the different use cases for end users. Additionally, the comparator used to determine the polarity of $N_{cycle}(8 \cdot \Delta V_{BE} - V_{BE})$ is also reused by the ADC 120 during normal conversion. The actual value $N_{cycle}$ can be selected based on the noise condition of the readout and the offset of the comparator.

FIG. 6C shows the readout configuration in normal temperature conversion after subranging (from the previous operations discussed in relation to FIG. 6B, the gain $k_{ff}$ and $k_{fb}$ can be determined), according to embodiments of the present disclosure. The second-stage 620 re-enabled, similarly to FIG. 6A. In the present example, the comparator is clocked at 2 femtoseconds ($f_s$). If the sensed temperature is below $T_r$, the gain combination is 2 and ⅓ for $k_{ff}$ and $k_{fb}$. If the sensed temperature is above $T_r$, the gain combination is 1 and ⅓ for $k_{ff}$ and $k_{fb}$. Note that other gain combinations will also work depending on the number of subranges and temperature sensing ranges.

FIGS. 7A-7D are sensor readout schematic diagrams, according to embodiments of the present disclosure. The diagrams consist of two input sampling paths ($C_{S1}$ and seven associated control switches, and $C_{S2}$ together with seven associated control switches), a feedback DAC ($C_{fb}$ and nine associated control switches), the first amplifier ($A_{1.1}$ and $A_{1.2}$), integration capacitor of the first integrator $C_{int1}$, two feedforward capacitors $C_{ff}$, one signal summer, the second integrator, one dynamic comparator, and one D-flip flop at the output. Note that $A_{1.1}$ consumes less power (relative to $A_{1.2}$) and is used for temperatures below $T_r$ (subrange one), and $A_{1.2}$ consumes more power (relative to $A_{1.1}$) and is used for temperature above $T_r$ (subrange two). The amplifier selection is controlled by the signal sel_k as generated during the subrange decision phase.

Figure 7A:
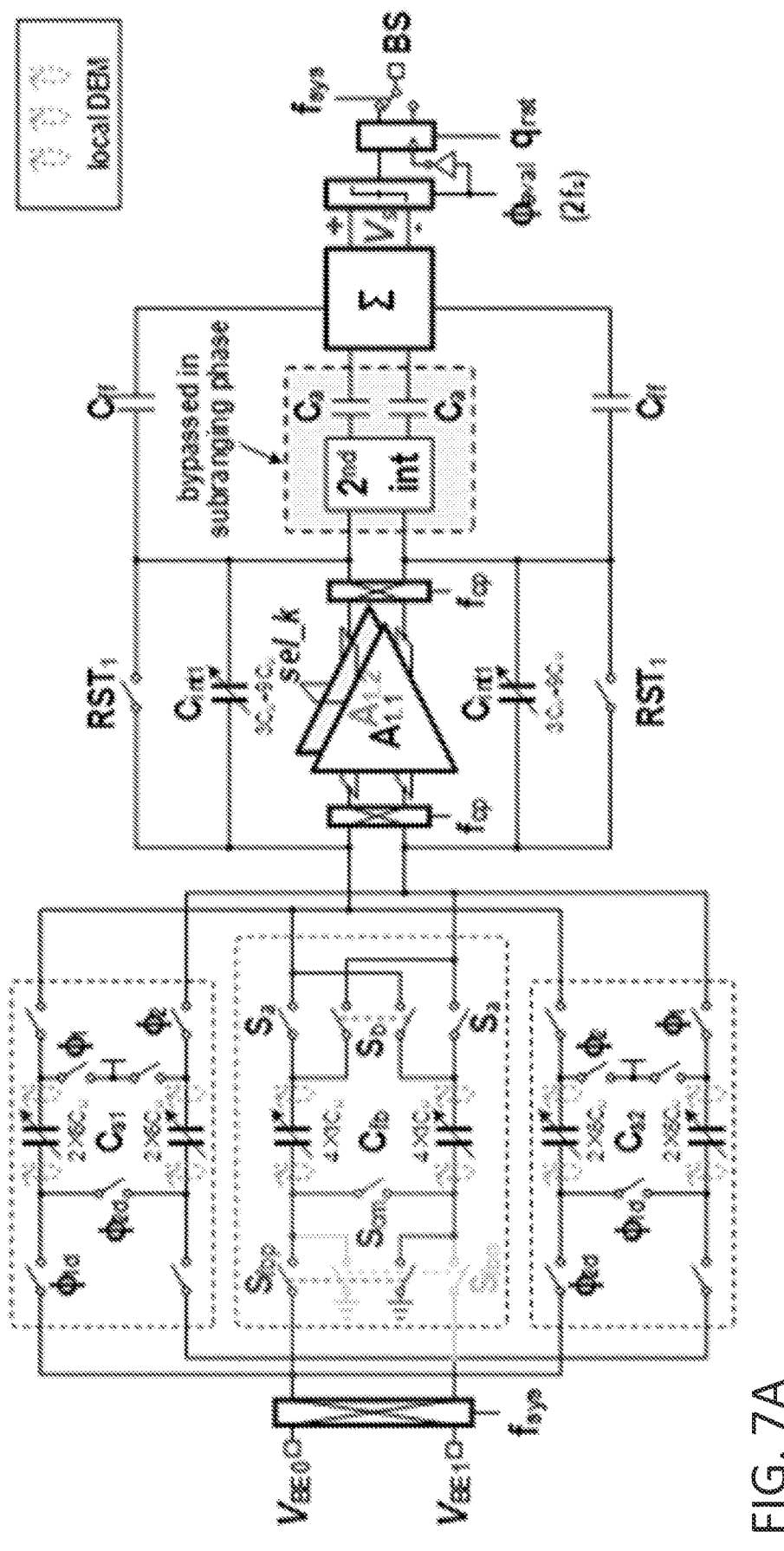
FIGS. 7A-7D are sensor readout schematic diagrams, according to embodiments of the present disclosure.
Figure 7B:
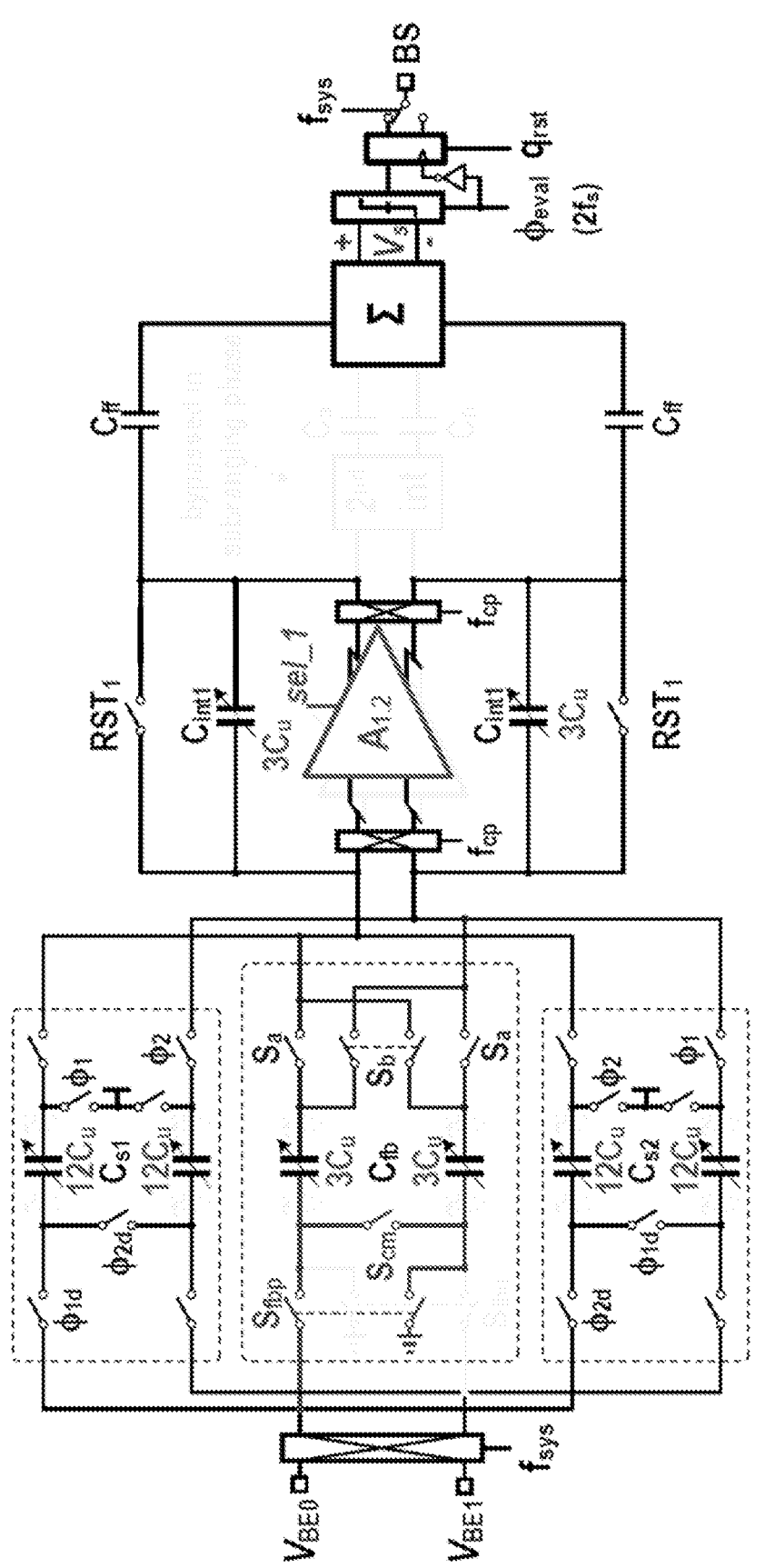
Figure 7C:
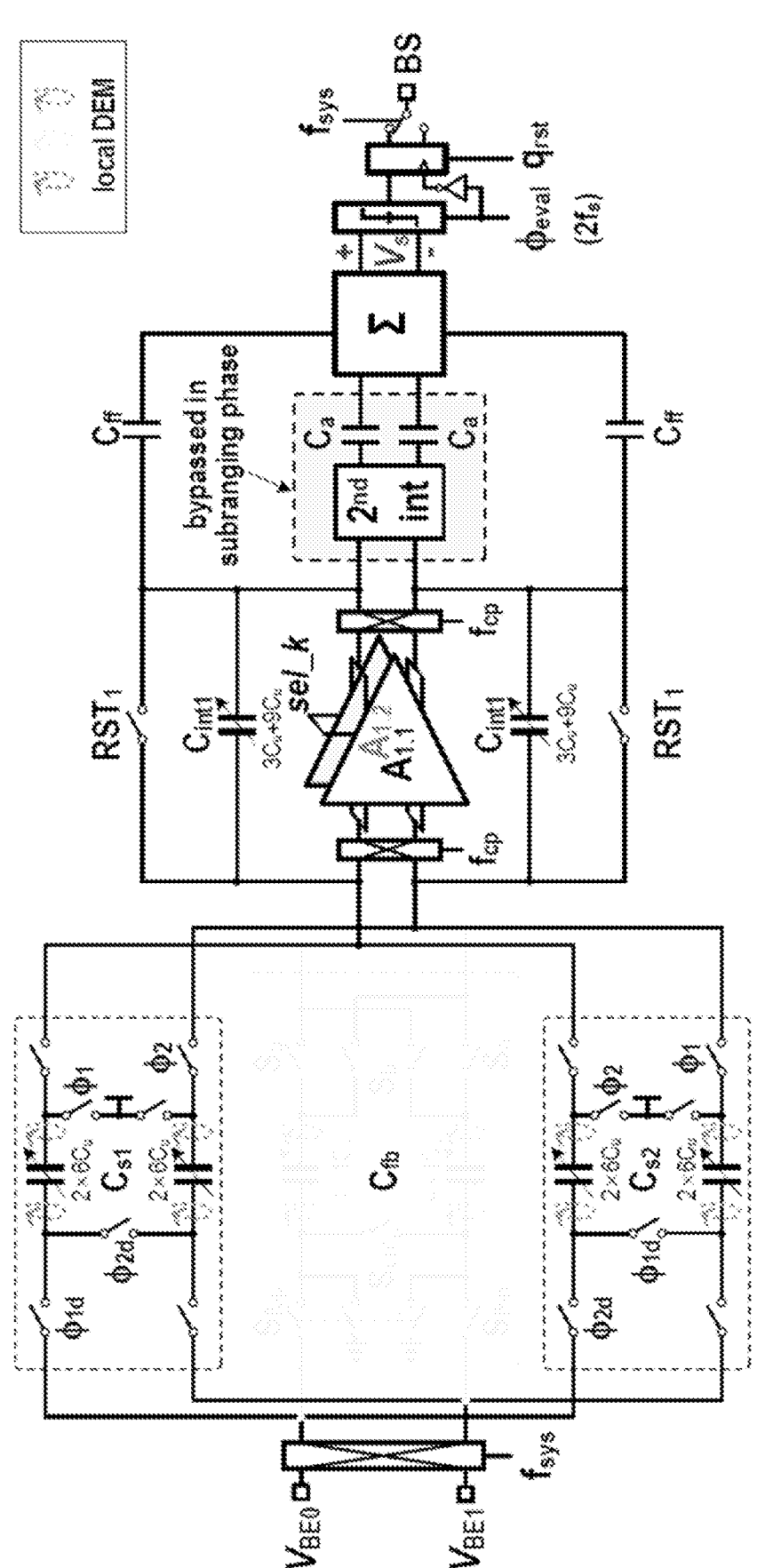
Figure 7D:
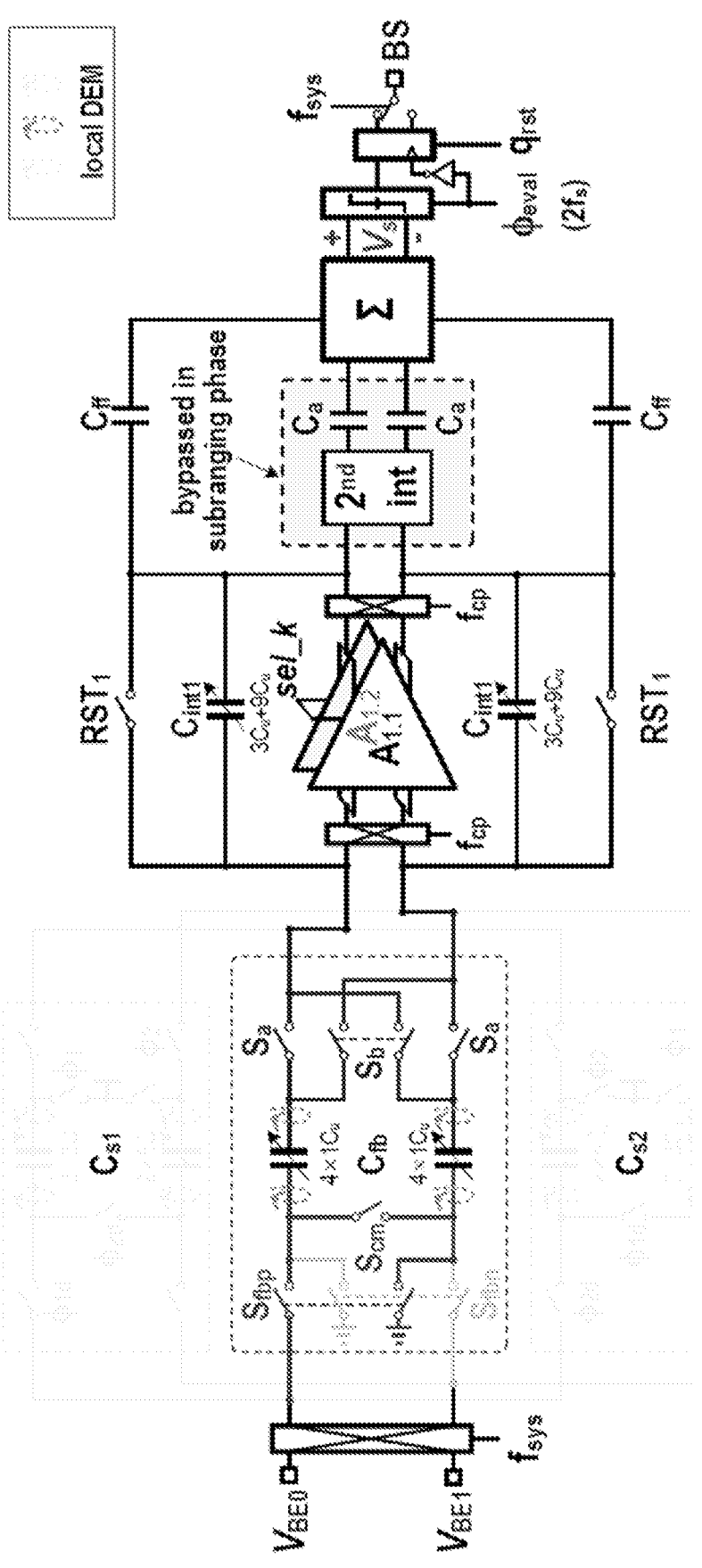

FIG. 7A shows the diagram in an overview state of the components, while FIGS. 7B-7D show the diagram in a configuration state for subranging, sampling, and feedback, respectively. In the subranging state shown in FIG. 7B, the amplifier with the higher power is used, while in the sampling state, the signal sel_k selects which amplifier to use.

Particularly, in the readout, the capacitors $C_{S1}$, $C_{S2}$, and $C_{fb}$ respectively consist of twelve, twelve, and four cap units (Cu) to achieve the gain reconfigurability of $k_{ff}$ and $k_{fb}$. Meanwhile, to improve the gain accuracy, a local capacitor dynamic element matching is provided. During operation, the unused cap units of $C_{S1}$, $C_{S2}$, and $C_{fb}$ are switched in periodically to maximize the effective capacitance thereof and thereby improve the gain precision of $k_{ff}/k_{fb}$. Note that in some embodiments, the frequency of the local_DEM of $C_{S1}$ and $C_{S2}$ are fixed while that of $C_{fb}$ is controlled by the sensor output BS to allow all of the cap units to contribute to the feedback operation equally. The readout may also be chopped at the system level with the control of $f_{sys}$ and two switch modules.

During conversion, the common mode signals of the $\{V_{BE0}, V_{BE1}\}$ and $\{V_{BE0}, GND\}$ pairs vary with temperature and may affect the readout operation. In this design, the common mode signals are cancelled by shorting the respective sampling capacitors' input plates during integration, the common mode cancellation switches are controlled by $\Phi_{1d}$, $\Phi_{1d}$, and $S_{cm}$ as in FIG. 7A.

Figures 8A, 8B:
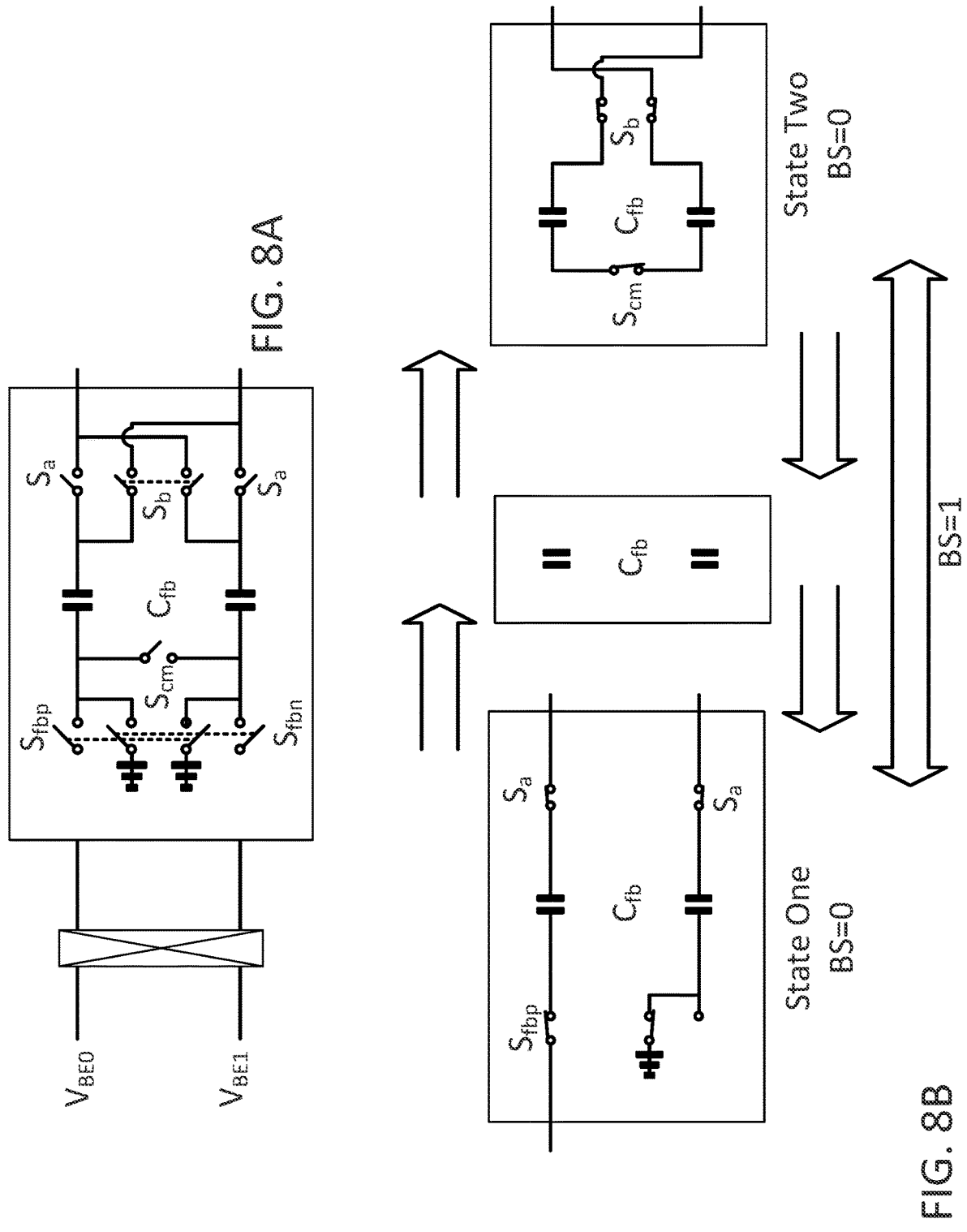
FIGS. 8A and 8B show a detailed DAC design and the control thereof, according to embodiments of the present disclosure.

FIGS. 8A and 8B show a detailed DAC design and the control thereof, according to embodiments of the present disclosure. When $f_{sys}=0$, at the beginning of the sensor readout operation, $C_{fb}$ are connected to the feedback signal $V_{BE0}$ and GND (state1). If the ADC 120 output BS is 0 (digital level low), the DAC 630 stays at this state without any switching operations. Once BS becomes 1 (digital level high), the DAC 630 switches from state one to state two to receive feedback. FIG. 8B also shows the switching intermediate stage 830 to minimize signal dependent charge injection. Then, if BS is 0, the DAC 610 stays at state two. Once BS becomes 1 again, the DAC 630 then switches back to state one again, and so on. Note that the DAC 630 does not sample the noise associated with $V_{BE0}$, which is another advantage of double-sampling besides two-times faster conversion speed.

The present disclosure may also be understood with reference to the following numbered clauses.

Clause 1: A temperature sensor comprising: a bipolar junction transistor (BJT) core; an Analog to Digital Converter (ADC); a digital controller; and an amplifier configured to receive a selection signal from the digital controller to provide a voltage differential from the BJT core to the ADC at one of a first gain or a second gain, different from the first gain, wherein the selection signal is based on a temperature sensed by the BJT core.

Clause 2: The temperature sensor of any of clauses 1 or 3-7, wherein the BJT cores senses the temperature based on a reference current received from a reference current generator affected by the temperature.

Clause 3: The temperature sensor of any of clauses 1-2 or 4-7 wherein the temperature sensor further comprises an output processing unit that linearizes a bias signal output from the ADC according to the one of the first gain or the second gain selected by the selection signal.

Clause 4: The temperature sensor of any of clauses 1-3 or 5-7, wherein the output processing unit is calibrated at a shared temperature for both the first gain and the second gain.

Clause 5: The temperature sensor of any of clauses 1-4 or 6-7, wherein the selection signal switches from the one of the first gain or the second gain to a different one of the first gain or the second gain when the temperature sensed by the BJT core is approximately 100 degrees Celsius.

Clause 6: The temperature sensor of any of clauses 1-5 or 7, wherein the BJT core includes a P-type metal-oxide-semiconductor (PMOS) diffusion area and an N-type metal-oxide-semiconductor (NMOS) diffusion area, smaller than the PMOS diffusion area.

Clause 7: The temperature sensor of any of clauses 1-6, wherein the selection signal is calibrated at a room temperature.

Clause 8: A method comprising: calibrating, at a shared temperature, a first gain and a second gain, different from the first gain, for a temperature sensor, wherein the first gain is associated with a first temperature range and the second gain is associated with a second temperature range different from the first temperature range; determining whether a reading temperature by the temperature sensor is within the first temperature range or the second temperature range; and applying, based on which of the first temperature range or the second temperature range that the reading temperature is within, one of the first gain or the second gain to a temperature reading signal.

Clause 9: The method of any of clauses 8 or 10, wherein the first temperature range includes temperatures that are equal to and below a given temperature and the second temperature range includes temperatures that are equal to and below the given temperature.

Clause 10: The method of any of clauses 8-9, wherein the shared temperature is a room temperature, between 15 and 30 degrees Celsius, and the given temperature is between 90 and 110 degrees Celsius.

Clause 11: A temperature sensing system comprising: a bipolar junction transistor (BJT) core; an Analog to Digital Converter (ADC); an amplifier; and a digital controller, configured to perform operations, including: calibrating, in the amplifier, a first gain and a second gain, different from the first gain, at a shared temperature, wherein the first gain is associated with a first temperature range and the second gain is associated with a second temperature range different from the first temperature range; determining whether a reading temperature measured by the BJT core is within the first temperature range or the second temperature range; generating a selection signal for the amplifier to apply one of the first gain or the second gain based on which of the first temperature range or the second temperature range that the reading temperature is within; and digitizing, via the ADC, the reading temperature for output of the reading temperature.

Clause 12: The temperature sensing system of any of clauses 11 or 13-15, wherein the system further comprises an output processing unit that linearizes a bias signal output from the ADC according to the one of the first gain or the second gain selected by the selection signal.

Clause 13: The temperature sensing system of any of clauses 11-12 or 14-15, wherein the system further comprises a reference current generator that is affected by temperature changes and supplies a first reference current to the BJT core by which to measure the reading temperature.

Clause 14: The temperature sensing system of any of clauses 11-13 or 15, wherein the first temperature range includes temperatures that are equal to and below a given temperature and the second temperature range includes temperatures that are equal to and below the given temperature.

Clause 15: The temperature sensing system of any of clauses 11-14, wherein the shared temperature is a room temperature, between 15 and 30 degrees Celsius, and the given temperature is between 90 and 110 degrees Celsius.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

It will be appreciated that all of the disclosed methods and procedures described herein can be implemented using one or more computer programs or components. These components may be provided as a series of computer instructions on any conventional computer readable medium or machine readable medium, including volatile or non-volatile memory, such as RAM, ROM, flash memory, magnetic or optical disks, optical memory, or other storage media. The instructions may be provided as software or firmware, and/or may be implemented in whole or in part in hardware components such as ASICS, FPGAs, DSPs or any other similar devices. The instructions may be configured to be executed by one or more processors, which, when executing the series of computer instructions, performs or facilitates the performance of all or part of the disclosed methods and procedures.

The examples may be embodied in the form of computer-implemented processes and apparatuses for practicing those processes. An example may also be embodied in the form of a computer program code containing instructions embodied in tangible media, such as floppy diskettes, CD-ROMs, DVD-ROMs, hard drives, or any other computer-readable non-transitory storage medium, wherein, when the computer program code is loaded into and executed by a computer, the computer becomes an apparatus for carrying out the method.

An example may also be embodied in the form of computer program code, for example, whether stored in a storage medium, loaded into and/or executed by a computer, or transmitted over some transmission medium, such as over electrical wiring or cabling, through fiber optics, or via electromagnetic radiation, where when the computer program code is loaded into and executed by a computer, the computer becomes an apparatus for carrying out the method. When implemented on a general-purpose microprocessor, the computer program code segments configure the microprocessor to create specific logic circuits.

The invention is claimed as follows:

1. A temperature sensor, comprising:
a bipolar junction transistor (BJT) core;
an Analog to Digital Converter (ADC);
a digital controller; and
an amplifier configured to receive a selection signal from the digital controller to provide a voltage differential from the BJT core to the ADC at one of a first gain or a second gain, different from the first gain, wherein the selection signal is based on a temperature sensed by the BJT core.

2. The temperature sensor of claim 1, wherein the BJT cores senses the temperature based on a reference current received from a reference current generator affected by the temperature.

3. The temperature sensor of claim 1, further comprising an output processing unit that linearizes a bias signal output from the ADC according to the one of the first gain or the second gain selected by the selection signal.

4. The temperature sensor of claim 3, wherein the output processing unit is calibrated at a shared temperature for both the first gain and the second gain.

5. The temperature sensor of claim 1, wherein the selection signal switches from the one of the first gain or the second gain to a different one of the first gain or the second gain when the temperature sensed by the BJT core is approximately 100 degrees Celsius.

6. The temperature sensor of claim 1, wherein the BJT core includes a P-type metal-oxide-semiconductor (PMOS) diffusion area and an N-type metal-oxide-semiconductor (NMOS) diffusion area, smaller than the PMOS diffusion area.

7. The temperature sensor of claim 1, wherein the selection signal is calibrated at a room temperature.

8. A method, comprising:
calibrating, at a shared temperature, a first gain and a second gain, different from the first gain, for a temperature sensor, wherein the first gain is associated with a first temperature range and the second gain is associated with a second temperature range different from the first temperature range;
determining whether a reading temperature by the temperature sensor is within the first temperature range or the second temperature range; and
applying, based on which of the first temperature range or the second temperature range that the reading temperature is within, one of the first gain or the second gain to a temperature reading signal.

9. The method of claim 8, wherein the first temperature range includes temperatures that are equal to and below a given temperature and the second temperature range includes temperatures that are equal to and below the given temperature.

10. The method of claim 9, wherein the shared temperature is a room temperature, between 15 and 30 degrees Celsius, and the given temperature is between 90 and 110 degrees Celsius.

11. A temperature sensing system, comprising:

a bipolar junction transistor (BJT) core;

an Analog to Digital Converter (ADC);

an amplifier; and a digital controller, configured to perform operations, including:

calibrating, in the amplifier, a first gain and a second gain, different from the first gain, at a shared temperature, wherein the first gain is associated with a first temperature range and the second gain is associated with a second temperature range different from the first temperature range;

determining whether a reading temperature measured by the BJT core is within the first temperature range or the second temperature range;

generating a selection signal for the amplifier to apply one of the first gain or the second gain based on which of the first temperature range or the second temperature range that the reading temperature is within; and digitizing, via the ADC, the reading temperature for output of the reading temperature.

12. The temperature sensing system of claim 11, further comprising an output processing unit that linearizes a bias signal output from the ADC according to the one of the first gain or the second gain selected by the selection signal.

13. The temperature sensing system of claim 11, further comprising a reference current generator that is affected by temperature changes and supplies a first reference current to the BJT core by which to measure the reading temperature.

14. The temperature sensing system of claim 11, wherein the first temperature range includes temperatures that are equal to and below a given temperature and the second temperature range includes temperatures that are equal to and below the given temperature.

15. The temperature sensing system of claim 14, wherein the shared temperature is a room temperature, between 15 and 30 degrees Celsius, and the given temperature is between 90 and 110 degrees Celsius.

\*   \*   \*   \*   \*